United States Patent [19]

Kataoka et al.

[11] Patent Number: 5,036,209
[45] Date of Patent: Jul. 30, 1991

[54] FABRICATION METHOD FOR SEMICONDUCTOR DEVICES AND TRANSPARENT MASK FOR CHARGED PARTICLE BEAM

[75] Inventors: Toyotaka Kataoka, Hamamatsu; Kiichi Sakamoto, Tokyo, both of Japan

[73] Assignee: Fujitsu Limited, Kawasaki, Japan

[21] Appl. No.: 424,733

[22] Filed: Oct. 20, 1989

[30] Foreign Application Priority Data

Oct. 20, 1988 [JP] Japan .............................. 63-264617
Oct. 24, 1988 [JP] Japan .............................. 63-267522

[51] Int. Cl.⁵ .............................................. H01J 37/04
[52] U.S. Cl. .................................. 250/492.2; 250/398
[58] Field of Search ............... 250/492.2, 398, 492.22, 250/492.23

[56] References Cited

U.S. PATENT DOCUMENTS

| | | | |
|---|---|---|---|
| 4,140,913 | 2/1979 | Anger et al. .................. | 250/492.2 |
| 4,169,230 | 9/1979 | Bohlen et al. .................. | 250/492.2 |
| 4,213,053 | 7/1980 | Pfeiffer .......................... | 250/398 |

*Primary Examiner*—Jack I. Berman
*Assistant Examiner*—Kiet T. Nguyen
*Attorney, Agent, or Firm*—Staas & Halsey

[57] ABSTRACT

A charged particle beam exposure apparatus includes a charged particle beam generator, a deflector device for deflecting the charged particle beam electromagnetically to individually illuminate small areas of a pattern forming region formed on a transparent mask, apparatus for moving the transparent mask mechanically, and the various components required for reducing the charged particle beam pattern through the mask and projecting the same onto a semiconductor device substrate to be exposed. A semiconductor device is fabricated using such apparatus by moving the mask mechanically to position a pattern forming region at a predetermined exposure position. The pattern forming region includes a plurality of small areas which can be individually selected by deflecting the charged particle beam when the pattern forming region is positioned at the exposure position. Each individual area is of a size such that the entirety thereof is exposed when the beam is deflected onto such area.

7 Claims, 6 Drawing Sheets

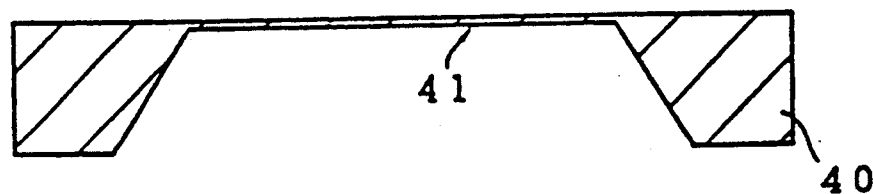
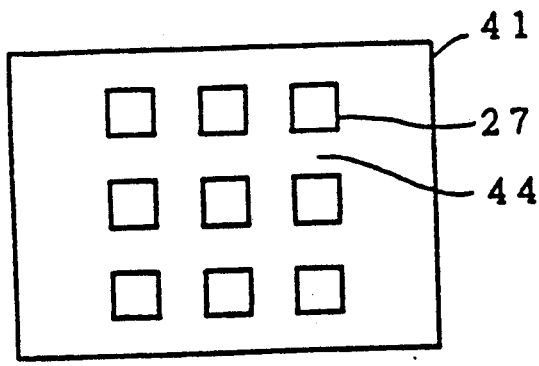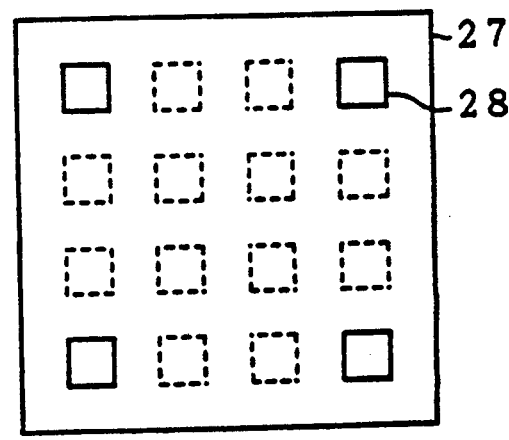

FABRICATION METHOD FOR SEMICONDUCTOR DEVICES AND TRANSPARENT MASK FOR CHARGED PARTICLE BEAM

FIELD OF THE INVENTION

The present invention relates to the fabrication of semiconductor devices employing charged particle beam exposure, such as electron beam exposure or the like, and to a transparent mask for patterning a charged particle beam.

The invention relates in particular to the fabrication of semiconductor devices by charged particle beam exposure of the formation beam type using a mask for transferring mask patterns, and to a transparent mask used in connection with such charged particle beam exposure.

In recent years, as the number of components on IC (integrated circuit) chips have increased, charged particle beam exposure such as electron beam exposure has rapidly been replacing lithographic exposure which has been used in the formation of circuit patterns of ICs for many years.

Charged particle beam exposure is used to form circuit patterns with the aid of electron beams and the like capable of electromagnetic control, and such exposure is advantageous in that it can be used to form submicron circuit patterns. Charged particle beam exposure methodology is roughly classified into the Gaussian type beam method and the formation beam method.

It is noted that, in the present specification, "electromagnetic" is intended to mean "electric or magnetic", and "electromagnetic control" is intended to mean "electric field control and/or magnetic field control".

DESCRIPTION OF THE PRIOR ART

Recently, there has been a rapidly growing tendency to use finer and finer patterns for semiconductor devices. Exposure by electron beam facilitates the production of submicron patterns and sufficiently meets the requirements of resolution. However, exposure by fine spot scan or subsequent shot exposure of a small variable rectangular beam is disadvantageous in that throughput cannot be enhanced because of a so-called one stroke exposure. Typically, the exposure of larger areas requires longer exposure times.

In order to overcome the lower throughput problem associated with the prior art, a block-pattern exposure method is described in Japanese Laid-Open Patent Publication No. 52-119815. In the block-pattern exposure method a mask with different patterns formed at different block locations thereon is provided in the path of an electron beam, and a desired block on the mask is selected by deflecting the electron beam to thereby expose the pattern of the selected block. If various circuit patterns are to be exposed by this method in a short period of time, a vast number of patterns on the mask is required. However, it is not practical to provide a mask with a vast number of such pattern blocks and to use such mask to perform electron beam exposure.

Although other methods based on the same concept as the aforementioned Japanese Laid-Open Patent Publication No. 52-119815 have been proposed, all such methods have been difficult to use.

Japanese Laid-Open Patent Publication No. 62-260322 proposes a beam shaping plate on which patterns numbering whole number multiples of the minimum unit of repeatedly formed patterns are formed along with at least one aperture in the form of square. By this square aperture, the beam shaping plate makes it possible to illuminate as many memory cell patterns as possible at the same time, while maintaining the generality of variable rectangular beam exposure. However, the methods which employ a beam shaping plate are also not practical because these methods require one beam shaping plate for each repeated pattern. Furthermore, in order to effectively reduce the number of exposures needed with the method described in the aforesaid Japanese Laid-Open Patent Publication No. 62-260322, the area of the small partition (or area) which is the repeat unit described above must be increased to the extent possible so as to contain as many transparent openings as possible so that as many patterns as possible can be formed by a single exposure. However, if the size of the small partition is increased, the charged beam must correspondingly be widened and the charge density of the charged beam is thus reduced. Consequently, the time for a single exposure must be increased. Therefore, enhancement of throughput using the aforementioned method is limited. For this reason, a method has been proposed where a plurality of small partitions of small area are formed on a transparent mask, and the small partitions are selected individually when necessary for exposure. However, since the area of the transparent mask itself must be increased as the number of the small partitions increases, and since a desired individual partition must be selected, when necessary, from the large number of small partitions, operations such as mechanical movements of the mask and deflections of the charged beam become numerous and a large amount of time is needed to perform the operations, and consequently the problem of enhancing throughput remains unsolved.

Accordingly, it is an object of the present invention to provide an improved method for fabricating semiconductor devices which is suited for effectively printing repeated patterns with the aid of a charged particle beam.

Another object is to provide an improved transparent mask for a charged particle beam which is suitable for fabrication of semiconductor devices having repeated patterns. Still another object is to provide an improved charged-beam exposure apparatus which is capable of reducing the time required to select a desired small partition or area from among a plurality of small areas on a transparent mask, as compared with the prior art, and which is thus capable of enhanced throughput.

SUMMARY OF THE INVENTION

In accordance with one important aspect of the present invention, a charged particle beam exposure apparatus comprises means for generating a charged particle beam, deflection means for deflecting the charged particle beam electromagnetically and illuminating a single discrete individual small area of a plurality of small areas that together constitute a pattern forming region formed on a transparent mask, mask movement means for moving said transparent mask mechanically, and reduction-exposure means for reducing the charged particle beam patterned through said mask and projecting the same on a semiconductor device to be exposed. The invention also provides a method for fabricating a semiconductor device which comprises the steps of generating a charged particle beam; providing a mask having a multiplicity of individual discrete areas, each having at least one transparent aperture, said areas being arranged on said mask in a number of pattern forming regions, with each such region comprising a plurality of said individual areas; moving said mask mechanically to place a selected one of said pattern forming regions at an electron beam illumination position; deflecting the charged particle beam electromagnetically to illuminate a single individual area of the selected region, whereby the beam is patterned by said single individual area; and reducing the patterned beam and projecting the reduced, patterned beam onto an object to be exposed.

In accordance with another important aspect of the present invention, a method is provided wherein the areas of each region are arranged and located such that each of the areas of a selected region may be selectively and singly illuminated by deflection of said beam when the selected region is at said position, the areas of each region including basic pattern groups representing at least a portion of a figure that is a repeat unit to be printed on said object, said mask being moved mechanically and said beam being deflected electromagnetically in accordance with print pattern information to sequentially expose the object to differently patterned beams.

In accordance with another important aspect of the present invention, there is provided a transparent mask for patterning a charged particle beam comprising a multiplicity of individual discrete areas, each having at least one transparent aperture, said areas being arranged in a number of regions, with each region comprising a plurality of said areas, each region containing a first set of areas patterned for variable rectangular shapes and a second set of areas patterned for shapes that are repeatedly used.

In accordance with another important aspect of the present invention, there is provided a transparent mask for patterning a charged particle beam. The mask comprises a plurality of pattern forming regions, each pattern forming region comprising a multiplicity of individual areas having at least one transparent aperture. The mask is provided with isolation regions separating each pattern forming region from neighboring pattern forming regions. The areas of at least one pattern forming region are arranged in first and second sets of areas with the apertures of the first set of areas presenting an aperture pattern that is an independent pattern used for a non-repeated pattern, and with the apertures of the second set of areas presenting a repeated basic pattern representing at least a portion of a figure that is a repeat unit. The size of each region is such that a charged particle beam may be deflected to illuminate each area thereof individually, and the size and arrangement of the areas of each region is such that each individual area may be selectively and singly illuminated by the deflected beam.

By using a relatively complicated pattern, the number of exposure shots can be greatly reduced. If patterns are included for all possible figures, then the number becomes vast. If such vast number of patterns is formed on a single transparent mask for a reduction exposure apparatus, the size of the transparent mask becomes so large that it easily exceeds the range in which a charged particle beam can be deflected electromagnetically. The time needed for electromagnetic deflection is of the order of microseconds, while many milliseconds are needed to mechanically move the transparent mask 3 (FIG. 1A). Consequently, exposure time is larger.

Repeated patterns can be effectively exposed in a short time by dividing the transparent mask into a multiplicity of discrete individual areas having at least one transparent aperture and forming one such area of a size such that the charged particle beam patterned thereby can be deflected electromagnetically to form basic repeated patterns which are convenient for printing figures including repeated patterns, and forming another individual area with an aperture pattern for a non-repeated pattern, and preparing repeated patterns of each area in correspondence with different figures.

A large number of figures can be effectively exposed with the aid of one transparent mask by providing a plurality of individual discrete areas having at least one transparent aperture in the mask, positioning a requested area within the deflection range of the charged particle beam, and thereafter moving the charged particle beam by electromagnetic deflection.

With reference to FIG. 1A, when a new pattern is to be exposed, the transparent mask 3 is moved by the mechanical drive means 9a and 9b, and an appropriate new pattern forming region 4 is selected.

Since the number of relatively larger patterns on the transparent mask 3 is reduced, it becomes easier to produce a latent image of a desired resolution.

In accordance with yet another important aspect of the present invention, there is provided a charged beam exposure apparatus comprising a transparent beam shaping mask formed with a multiplicity of individual small areas, each of which has one or more apertures corresponding to components of circuit patterns of an integrated circuit, said areas being arranged on said mask in a number of pattern forming regions, with each such region comprising a plurality of said individual areas, the layout of said regions being such that regions which are close in time in accordance with a predetermined exposure sequence of an object to be exposed are close in location, and the layout of the individual areas within each region being such that individual areas which are close in time in accordance with said predetermined exposure sequence are also close in location.

The transparent mask may have formed thereon all of the apertures required for exposure of a given integrated circuit, whereby the pattern exposure required for fabrication of said given integrated circuit may be performed without changing said transparent mask.

According to the present invention, the small areas are arranged within the respective region in accordance with a predetermined exposure sequence, and likewise the regions are also arranged in accordance with the predetermined exposure sequence. For this reason, the time needed for mechanical mask movement to select and expose a desired small area and the time needed for charged beam deflection is minimized without regard to the number of small areas. Consequently, the time needed to expose all desired patterns on an object to be exposed can be greatly reduced, as compared with the prior art.

BRIEF DESCRIPTION OF THE DRAWINGS

The features and advantages of the fabrication method for semiconductor devices and the transparent mask for charged particle beams according to the present invention will be more clearly understood from the following description taken in conjunction with the accompanying drawings wherein:

FIG. 2B is a cross-sectional view of the transparent mask used in the apparatus of FIG. 2A;

FIG. 2C is a plan view of the central portion of the transparent mask of FIG. 2B and illustrating a plurality of regions of individual areas;

FIG. 2D is an enlarged plan view showing the layout of the small individual areas within one of the pattern forming regions of the transparent mask of FIG. 2C;

DESCRIPTION OF THE PREFERRED EMBODIMENTS

Figure 1A:
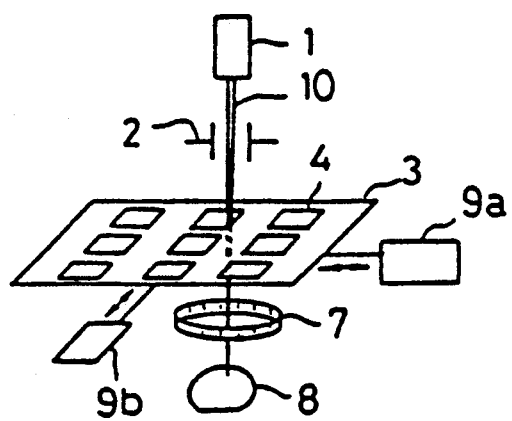
FIG. 1A is a schematic view of a charged particle beam exposure apparatus which serves to explain the basic concepts of the present invention.
Figure 1B:
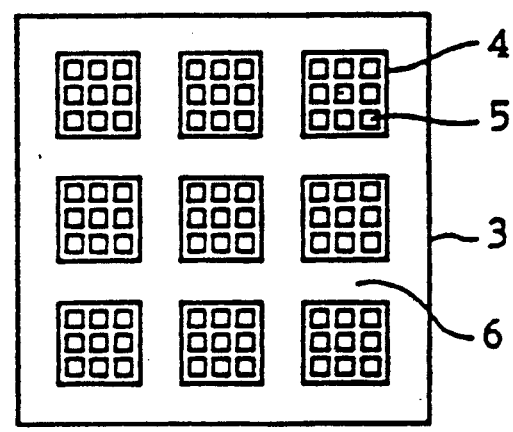
FIG. 1B is an enlarged plan view of a transparent mask for use in connection with the apparatus of FIG. 1A.
Figure 1C:
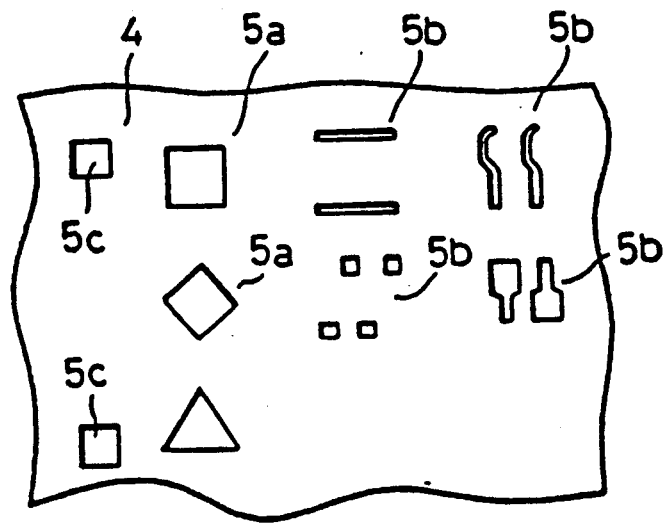
FIG. 1C is a fragmentary plan view, on a greatly enlarged sale, of various patterns formed on a small area of the mask of FIG. 1B.

The basic concepts of the present invention are shown in FIGS. 1A, 1B and 1C of the accompanying drawings. In FIG. 1A, a beam of charged particles 10 is ejected from a charged particle beam generation means 1, deflected by deflection means 2 for electromagnetically deflecting a charged particle beam, and projected onto a transparent mask 3. The transparent mask 3 is mechanically moved by mechanical drive means 9a and 9b. As shown in FIG. 1B, a plurality of pattern forming regions 4 are formed on the transparent mask 3. Each of the regions 4 is subdivided into a plurality of individual small areas 5. Each small area 5 is of a size which the charged particle beam 10 is able to illuminate simultaneously, while each region 4 is of a size to be totally within the range which can be scanned by the charged particle beam 10 with the aid of the deflection means 2. As shown in FIG. 1C, a small area 5 contains a group of patterns including repeated basic patterns 5b, each representing at least a portion of a figure which is a repeat unit of repeated patterns, and aperture patterns 5a for composing a non-repeated portion using the same variable rectangular patterns as the prior art. If necessary, the small area 5 may also contain registration patterns 5c. The registration patterns 5c are provided at predetermined locations in each region 4 and are used for registration of the small area 5. The repeated basic patterns 5b are convenient to compose particular repeated patterns of a semiconductor device to be fabricated, and the same are selected so that charged particle beams of small aberration can be obtained. For example, one cell to several cells of DRAM (dynamic random-access memory) or one cell to at least a portion of several cells of SRAM (static random-access memory) can be made the object of the repeated basic patterns 5b. The repeated basic pattern 5b are constructed such that repeated patterns can be printed by connecting one repeated basic pattern itself in head-to-tail manner or connecting a combination of some of them in head-to-tail manner. For example, as shown on the right side of FIG. 1C, when a circuit figure is to be composed of rectangular patterns, there are patterns including a plurality of sets of composite rectangular patterns each made up of a plurality of rectangular patterns, and each including a plurality of rectangular patterns disposed at the right side of the composite rectangular patterns. As in the prior art, that portion of a circuit pattern that is not repeated is made by combining various rectangular apertures, because if patterns of complicated configuration are to be made, a vast number of different patterns would be required. For this reason, the aperture patterns 5a are needed. As a result, it is desirable that aperture patterns 5a of rectangular shape and the like and of at least partially common shape be provided in each of many regions 4 made up of areas 5.

The charged particle beam 10 patterned through the transparent mask 3 is reduced and projected onto an object 8 to be exposed, by reduction exposure means 7.

An embodiment of the present invention is shown in FIGS. 2A through 2D.

Figure 2A:
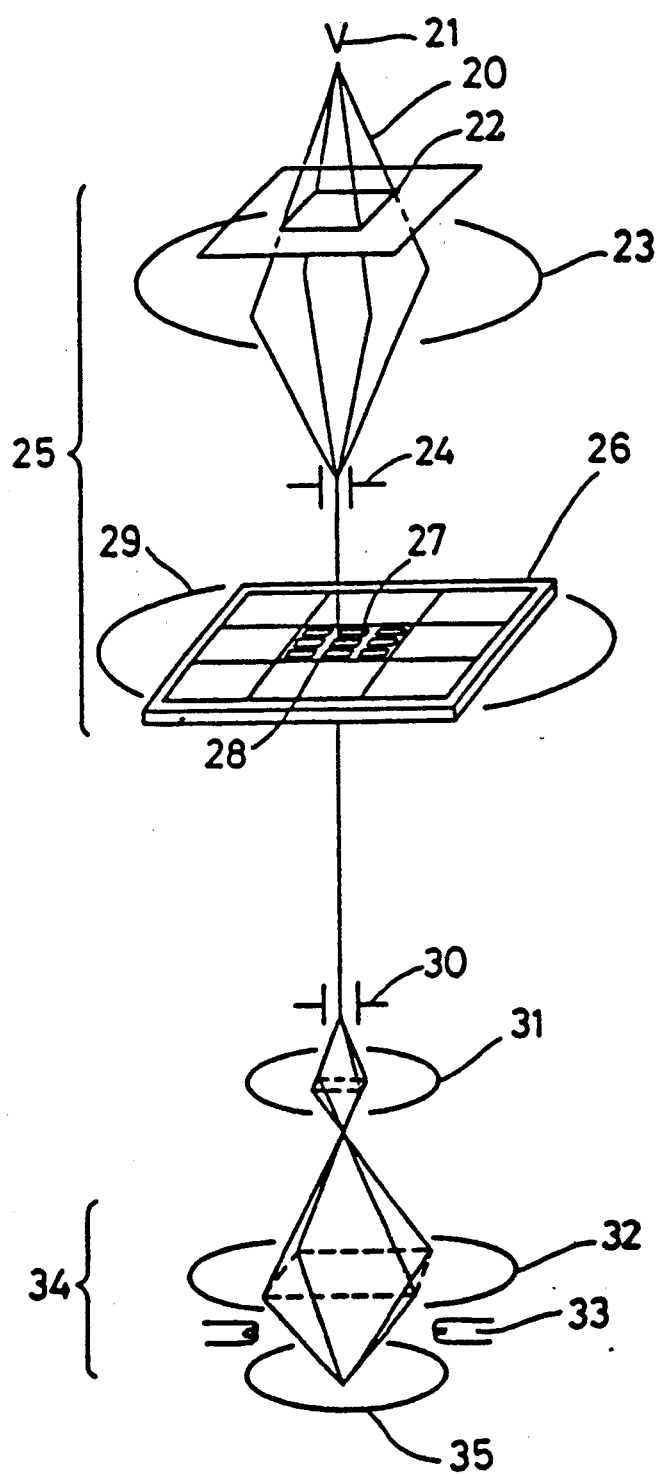
FIG. 2A is a perspective view illustrating an electron beam exposure apparatus for carrying out the fabrication method for semiconductor devices according to the present invention.

FIG. 2A schematically illustrates an electron beam exposure apparatus. A beam of electrons 20 ejected from an electron gun 21 is formed into a rectangular shape with a first formation aperture 22, and is focused with a lens 23. The focused electron beam 20 is deflected by a deflector 24, and illuminated onto a selected repeated basic pattern of an arbitrary small area 28 within one pattern forming region 27 on a transparent mask 26. The electron beam 20 thus patterned is focused at a deflector 30 by a lens 29. Thereafter, the focused patterned electron beam 20 is projected to a reduction lens 31 and further deflected and exposed onto a wafer 35 by a deflection unit 34 having a lens 32 and a deflector 33. One pattern forming region 27 of the transparent mask 26 includes variable rectangular apertures (slits having no pattern) that are used for patterns that are not repeated.

The first formation aperture 22 is used to define the outline of the electron beam 20 so that the beam 20 illuminates only one small area 28 on the transparent mask 26 and does not illuminate neighboring small areas 28.

The deflector 24 for selecting a small area 28 is used to deflect the electron beam 20 within the confines of a single pattern forming region 27. For example, a deflection of the order of 3 to 5 mm in one direction can be made on the transparent mask 26.

The electron beam 20 patterned by the aperture of one small area 28 on the transparent mask 26 is focused by the lens 29 and reduced, for example, to 1/100 its original size by the reduction lens 32. By reducing the beam, fine printing patterns are achieved. Accordingly, when finer patterns are desired, it is preferable that the patterns of the mask 26 be exposed using a larger reduction ratio.

The transparent mask 26 comprises a silicon wafer 40, the central portion 41 of which is in the form of a thin stencil provided with aperture patterns, as shown in FIG. 2B. Of course, the mask may be made from a metal plate and the like. The central portion 41 of the transparent mask 26 is of a rectangular shape, between 30 and 50 mm on each side and the same is provided with a plurality of the pattern forming regions 27, as shown in FIG. 2C. Each region 27 is rectangular and has dimensions of 3 to 5 mm on each side, dimensions which are within the range that the electron beam can be deflected without mechanically moving a mask stage. The pattern forming regions 27 are isolated from each other by isolation regions 44.

Each region 27 includes a plurality of small individual areas 28 in the form of a matrix, as shown in FIG. 2D. Each small area 28 is of a rectangular shape and has a dimension of 200 to 500 μm on each side. The size of the small area 28 is determined by the size of an electron beam that can project an image of mask patterns with high fidelity onto the wafer 35 that is a object to be exposed.

Figure 3A:
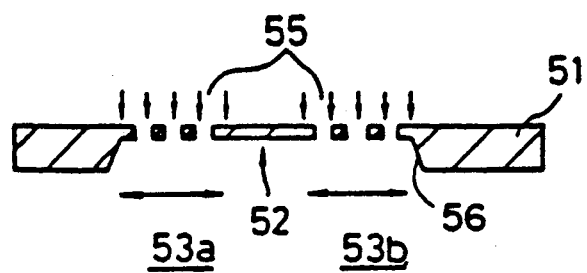
FIG. 3A is a cross-sectional view illustrating schematically the structure of an embodiment of a transparent mask of the invention.
Figure 3B:
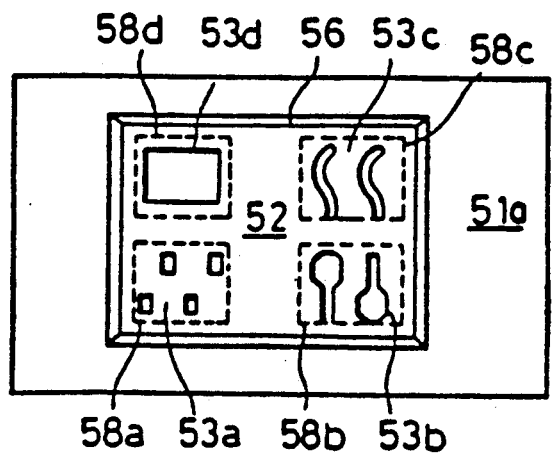
FIG. 3B is a bottom plan view of the transparent mask of FIG. 3A.

FIGS. 3A and 3B schematically illustrate an example of the structure of a respective aggregation of partitions.

In FIG. 3A, a Si substrate 51 has, at its back surface, a generally U-shaped configuration formed by etching. The thin central portion 52 is provided with transparent patterns 53a and 53b upon which an electron beam 55 is incident from the upper surface of the substrate 51.

FIG. 3B is a bottom plan view of the transparent mask of FIG. 3A. Between the thin central portion 52 and the thick marginal portion 51a there is a portion 56 that is gradually reduced in thickness. The central portion 52 forms one pattern forming region that is divided into pattern forming areas 58a, 58b, 58c and 58d which are small discrete individual areas. The pattern forming areas 58a, 58b, 58c and 58d are provided with respective transparent aperture patterns 53a, 53b, 53c and 53d. Transparent pattern 53a includes four rectangles, transparent pattern 53b includes two shapes with enlarged ends that are disposed in inverse parallel relationship, and transparent pattern 53c includes two meander-shaped parallel paths. These patterns provide figures that become the repeat units of repeated patterns. Transparent pattern 53d provides a single aperture for a pattern that is not repeated, and an incident beam is normally formed using two sides of this aperture.

An actual transparent mask includes a plurality of such pattern forming regions, and also it is normally preferable that the number of patterns within each region be much greater than shown.

In the exposure process, for example, for one chip of a semiconductor device, the repeated basic patterns are exposed in sequence. For example, two elongated lines in the longitudinal direction are exposed by sequentially exposing the pattern 53c of FIG. 3B in the longitudinal direction.

When a new shape is to be exposed, a suitable pattern forming region is selected according to the desired shape, and the mask is mechanically moved to bring the selected region into an electron beam illumination position.

Figure 4A:
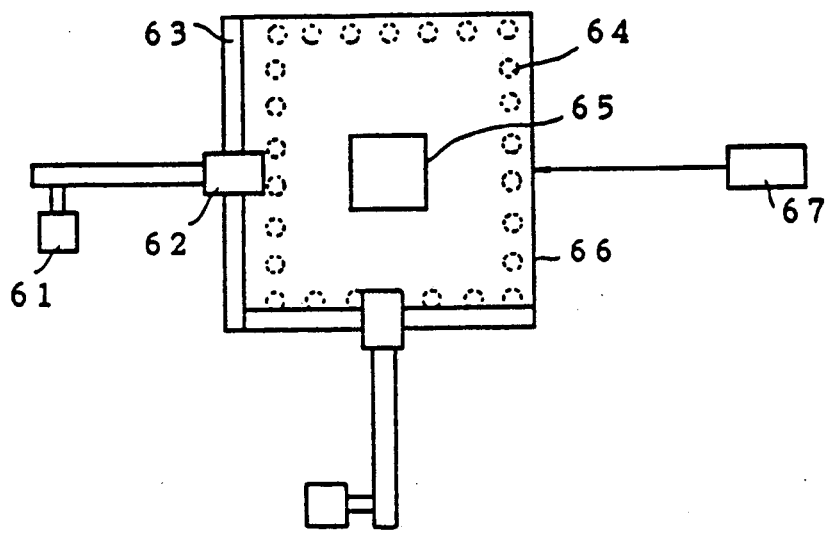
FIG. 4A is a schematic plan view of a mechanical movement mechanism for positioning a mask at an electron beam illumination position.
Figure 4B:
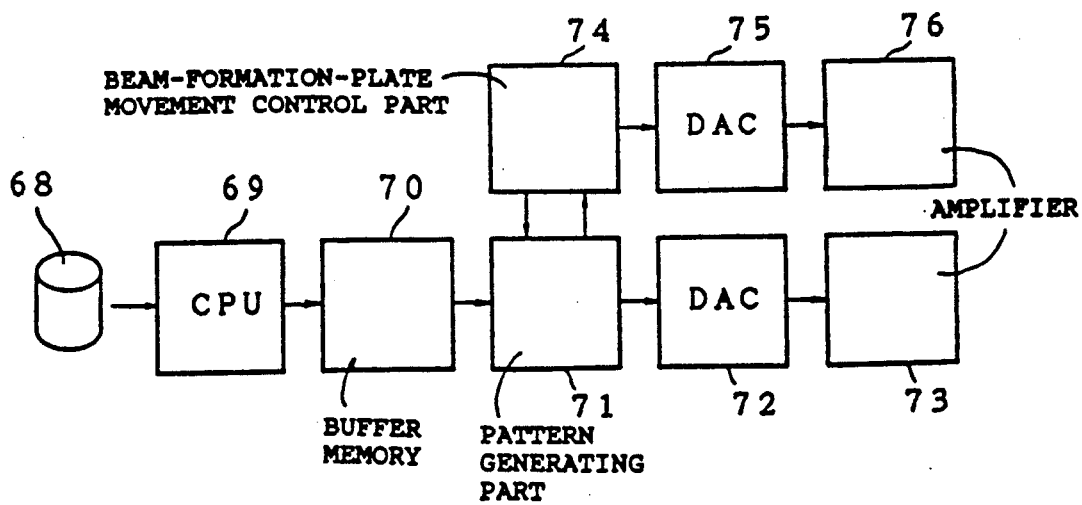
FIG. 4B is a block diagram illustrating the interrelationship between the major process steps used to mechanically move the mask to an electron beam illumination position.

FIGS. 4A and 4B show an example of a mechanical movement mechanism.

In FIG. 4A, a drive motor is designated by 61, and a coupling by 62. The coupling 62 is mounted on a guide 63. The balls 64 support a mirror 66 and are rotatable in all directions, and a mask plate 65 with patterns thereon is placed on mirror 66 as shown. Mirror 66 is provided to reflect light generated from a laser 67 and measure it. A laser measuring unit (not shown) is also provided in the longitudinal direction to monitor the position of the mask plate and precisely position the mask plate relative to the electron beam illumination position.

FIG. 4B illustrates the interrelationship between the major process steps used to mechanically move the mask plate to the electron beam illumination position. Exposure date is provided by a CPU (central processing unit) 69 in accordance with figure data in a file 68, and such data is stored in a buffer memory 70. A pattern generating part 71 retrieves the exposure data, a beam-formation-plate movement control part 74 generates a command to move a requested pattern forming region to the electron beam illumination position, and the motor 61 is driven through a DAC (digital to analog converter) 75 and an amplifier 76. After mechanical movement of the requested pattern forming region, the pattern generating part 71 reads the pattern of the exposure data, and controls the electron beam through a DAC 72 and an amplifier 73.

As described above, since the repeated basic patterns that are needed for exposing a single repeated pattern are accumulated within a single area, the repeated pattern can be exposed in a shorter time. In addition, since a plurality of individual areas are formed on a single transparent mask, various repeated patterns can be printed.

Figure 5A:
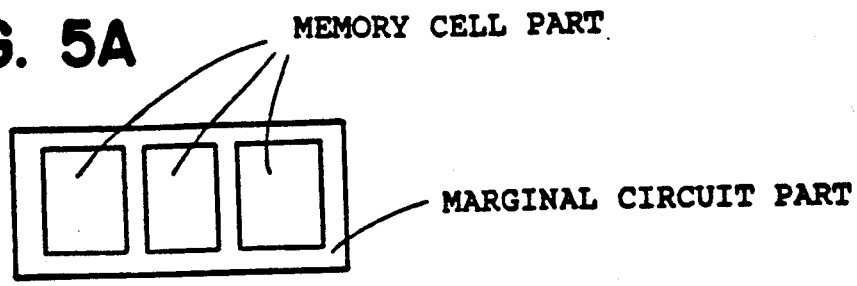
FIG. 5A is a plan view illustrating schematically an 1C memory chip consisting of memory cell parts and a marginal circuit part.
Figure 5B:
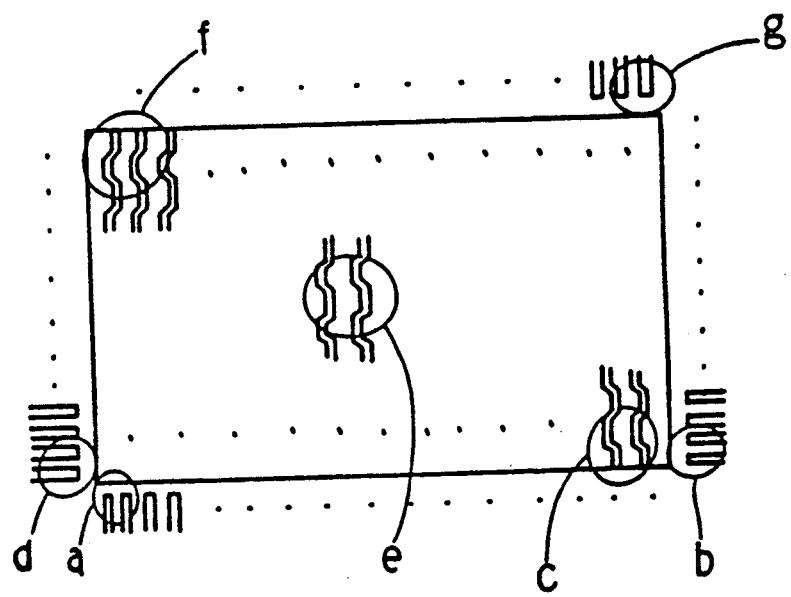
FIG. 5B is an enlarged plan view illustrating the layout of small areas having one or more apertures selected from patterns of memory cell parts and marginal circuit parts with respect to a wiring layer pattern selected from among the underlying layer patterns comprising the IC memory of the FIG. 5A.
Figure 5C:
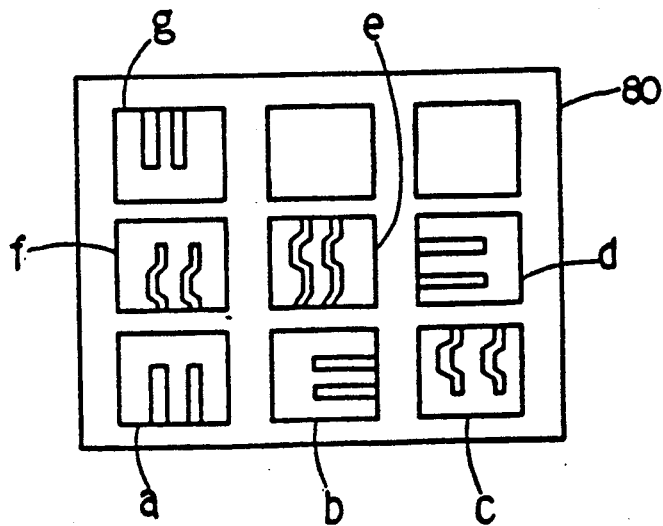
FIG. 5C is an enlarged plan view illustrating schematically the layout of patterns on one pattern forming area on the mask, in accordance with which the wiring layer pattern of FIG. 5B is obtained.

FIG. 5A schematically illustrates an IC memory chip consisting of memory cell parts and a marginal circuit part. The patterns of an IC memory and the like are generally formed by piling a multiplicity of patterned layers on top of one another. Small areas including transparent patterns that correspond to the components of the layer patterns are selected from among all of the underlying layers comprising the IC memory, and such areas are formed on the transparent mask in accordance with a preselected exposure sequence. In FIG. 5B, the letters a to g respectively represent small areas selected from patterns of the memory cell parts and the marginal circuit parts with respect to a wiring layer pattern among the underlying layer patterns comprising the IC memory. These small areas are disposed within one region 80 on the transparent mask, for example, in the order as shown in FIG. 5C, and the exposure is done in the order of a . . . bc . . . d(e . . . be . . . d)f . . . bg. Note that symbols within the parentheses are repeatedly used as occasion demands. The size of the region 80 is determined such that any small area within the aggregation 80 can be individually selected by charged-beam deflection means without mechanically moving the transparent mask, and in the case that the number of small areas required is large and thus cannot be included in a single region, such areas are formed in a neighboring region. Also, in order to reduce the number of mechanical mask movements, small area including identical patterns can be disposed repeatedly in different regions.

After the transparent mask formed as described above has been placed in a predetermined position in the electron beam exposure apparatus shown in FIG. 2, the small areas are subsequently selected and exposed by the transparent-mask movement means, deflector and the like, and consequently the wiring layer pattern as shown in FIG. 5B can be obtained.

By selecting small areas in the same manner as described above and arranging them on the transparent mask in the same manner as described above with respect to layer patterns other than the wiring layer, all of pattern exposures required for IC memory fabrication can be performed with one transparent mask.

Also, by providing the transparent mask with small areas including non-repeated patterns in additions to the aforementioned small areas for repeated patterns, variable rectangular patterns can also be obtained at the same time by using the small areas for non-repeated patterns in combination with the rectangular pattern 22 on the transparent mask.

As described previously, the embodiment shown in FIGS. 5A and 5C is characterized in that the layout between the small areas within a single pattern forming region are determined so that the small areas which are close to time in accordance with the predetermined exposure sequence of an object to be exposed, are close in location. Also in FIG. 5B, the layout of the pattern forming regions can be determined so that the regions which are close in time in accordance with the exposure sequence of an object to be exposed, are close in location. For example, a basic repeated portion of the patterns on a single layer of, for example, an SRAM or the like may be divided into more than two patterns, which are disposed in neighboring small areas of a single region on the mask. On the other hand, in the case of forming patterns of different layers, the small areas may be formed on neighboring regions on the mask.

In accordance with the present invention the distance of movement and number of movements of the transparent mask, and the distance of deflection of the charged beam are minimized. Thus, the time required for exposure is reduced when compared with the prior art, thereby enhancing the throughput of the charged beam exposure apparatus.

The invention has been described in detail with particular reference to preferred embodiments thereof but it will be understood that variations and modifications can be effected within the scope of the invention.

What we claim is:

1. A method for fabricating a semiconductor device comprising:
    generating a charged particle beam;
    providing a mask having a multiplicity of individual discrete areas, each having at least one transparent aperture, said individual areas being arranged on said mask in a number of pattern forming regions, with each region comprising a plurality of said individual areas;
    moving said mask mechanically to place a selected one of said regions at an electron beam illumination position;
    deflecting the charged particle beam to illuminate a single individual area of the selected region whereby the beam is patterned by the apertures of said single individual area; and
    reducing the patterned beam and projecting the reduced, patterned beam onto an object to be exposed.

2. A method as set forth in claim 1, wherein the areas of each region are arranged and located such that each of the areas of a selected region may be selectively and singly illuminated by deflection of said beam when the selected region is at said position, the areas of each region including at least one basic pattern group representing at least a portion of a figure that is a repeat unit to be printed on said object, said mask being moved mechanically and said beam being deflected in accordance with print pattern information to sequentially expose the object to differently patterned beams.

3. A transparent mask for patterning a charged particle beam comprising a multiplicity of individual discrete areas, each having at least one transparent aperture, said areas being arranged in a number of pattern forming regions with each region comprising a plurality of said areas,
    the size of each pattern forming region being such that a charged particle beam may be deflected to illuminate each area thereof individually, and
    the size and arrangement of the areas of each pattern forming regions being such that each individual area may be selectively and singly illuminated by the deflected beam.

4. A transparent mask as set forth in claim 3, wherein each region contains a first area having apertures patterned for variable rectangular shapes and a second area having apertures patterned for shapes that are repeatedly used.

5. A transparent mask for patterning a charged particle beam comprising:
    a plurality of pattern forming regions, each pattern forming region comprising a multiplicity of individual discrete areas having at least one transparent aperture; and
    isolation regions separating each pattern forming region from neighboring pattern forming regions,
    the areas of at least one pattern forming region being arranged in first and second sets of areas, each of the areas of the first set having an aperture pattern that is an independent pattern used for a non-repeated pattern, and each of the areas of the second set having an aperture pattern for a repeated basic pattern representing at least a portion of a figure that is a repeat unit,
    the size of each pattern forming region being such that a charged particle beam may be deflected to illuminate each area thereof individually, and
    the size and arrangement of the areas of each pattern forming region being such that each individual area may be selectively and singly illuminated by the deflected beam.

6. A charged beam exposure apparatus comprising a transparent beam shaping mask formed with a multiplicity of small discrete areas having transparent apertures corresponding to components of circuit patterns of an integrated circuit, said areas being arranged on said mask in a number of pattern forming regions with each region comprising a plurality of said individual areas, the layout of said regions being such that regions which are close in time in accordance with a predetermined exposure sequence of an object to be exposed are close in location, and the layout of the individual areas within each region being such that individual areas which are close in time in accordance with said predetermined exposure sequence are also close in location.

7. A charged beam exposure apparatus as set forth in claim 6, wherein said transparent mask has formed thereon all of the individual areas required for exposure of a given integrated circuit, whereby the pattern exposure required for fabrication of the given integrated circuit may be performed without changing the transparent mask.

* * * * *